United States Patent [19]
Yurchenco et al.

[11] Patent Number: 5,829,601
[45] Date of Patent: Nov. 3, 1998

[54] PROCESSOR CARD ASSEMBLY RETENTION SYSTEM

[75] Inventors: James R. Yurchenco; Alexander Z. Nosler; Patrick L. Hall, all of Palo Alto, Calif.

[73] Assignee: Intel Corporaiton, Santa Clara, Calif.

[21] Appl. No.: 741,023

[22] Filed: Oct. 30, 1996

[51] Int. Cl.$^6$ .................................. A47F 7/00; H05K 7/14
[52] U.S. Cl. ........................ 211/41.17; 361/740; 361/754; 361/759
[58] Field of Search ................................ 211/41.1, 41.17, 211/4; 361/157, 796, 798, 740, 749, 754, 756, 759

[56] References Cited

U.S. PATENT DOCUMENTS

| | | | |
|---|---|---|---|
| 4,462,499 | 7/1984 | Calabro | 211/41.17 |
| 4,700,846 | 10/1987 | Schroder | 211/41.17 |
| 5,162,979 | 11/1992 | Anzelone et al. | 361/754 X |
| 5,216,578 | 6/1993 | Zenitani et al. | 211/41.17 X |
| 5,283,713 | 2/1994 | Nagafuji et al. | 211/41.17 X |
| 5,432,682 | 7/1995 | Giehl et al. | 211/41.17 X |
| 5,500,784 | 3/1996 | Thomas et al. | 211/41.17 X |
| 5,594,627 | 1/1997 | Le | 361/759 X |
| 5,650,917 | 7/1997 | Hsu | 361/740 X |

*Primary Examiner*—Robert W. Gibson, Jr.
*Attorney, Agent, or Firm*—Blakely, Sokoloff, Taylor & Zafman

[57] ABSTRACT

An apparatus for retaining a processor card of a processor card assembly in a connected position including a first and a second retention arm having a first and a second window respectively for accepting a first and a second latch of the processor card assembly for latching the processor card assembly to the apparatus. Each retention arm further includes a first and a second support and fastening feature disposed at opposite sides of a bottom end of the retention arm. Each support and fastening feature includes at least one capturing arm for capturing in place a threaded bushing for accepting a threaded fastener for fastening the apparatus to the motherboard.

15 Claims, 8 Drawing Sheets

PROCESSOR CARD ASSEMBLY RETENTION SYSTEM

BACKGROUND OF THE INVENTION

1. Field of the Invention

The present invention relates to the field of computer system packaging. More specifically, it relates to an apparatus for mechanically stabilizing and retaining a processor card assembly, such that the processor card of the processor card assembly will stay connected to a backplane (also referred to as a motherboard) of a computer system.

2. Background Information

For a variety of reasons, including but not limited to interchangeability and expandability, most electronic systems, whether analog or digital, typically are modular in design. Different aspects or functions of a system are implemented on different circuit boards, thus allowing systems of varying degrees in functionality to be easily put together by including or excluding certain circuit boards. It also allows systems to be easily upgraded with additional functions by adding or replacing certain circuit boards.

Very often, one of the circuit boards is considered to be the main circuit board, against which all the other circuit boards are connected. The main circuit board is often referred to as the backplane or the motherboard, whereas the other circuit boards are often referred to as the add-on boards/cards or daughter cards. For example, in the case of personal computers, traditionally, the circuit board where the main components such as the processor and the memory are mounted is considered the motherboard. The expansion or optional functions, such as serial/parallel interfaces, game adapters, graphics and/or video adapters, network adapters, and modems, are implemented using add-on/daughter cards, which are connected to the expansion slots or connectors of the motherboard. However, in recent years, the role of the expansion slots/connectors is beginning to blur, as manufacturers begin to package processors and memory components on daughter cards, also referred to as processor cards.

In order for a system to operate properly, the connections between the add-on/daughter cards and the motherboard must be kept unbroken, especially in the case of a processor card. This is generally not a problem during normal operation. However, when a system is moved or otherwise exposed to mechanical shock and vibration, the connections may become disengaged. The mechanical shock and vibration may come in any number of directions including but not limited to the direction parallel to the motherboard or the direction parallel to the add-on/daughter cards.

A number of approaches have been devised by system manufacturers to address this problem. At one end of the spectrum, the backplane/motherboard and the add-on/daughter cards are housed in a rigid mechanical structure called a card cage, which provides a frame to which daughter cards are attached by clips or screws. This is an effective but expensive solution. At the other end of the spectrum, many I/O add-on cards are retained by providing a bracket at one side edge of the circuit board, and securing the bracket against the rear frame of the system chassis. This is an inexpensive solution. However, it is not suitable for daughter cards that have high rigidity or stability requirements, or daughter cards that are "centrally" located, away from the chassis, such as the case of a processor card.

In between, a number of approaches are employed to provide the desired increased rigidity and stability, but without substantial increase in cost. For example, U.S. Pat. No. 5,162,979 disclosed an approach of using two pivotal levers and complementary fulcrums to secure the opposing side edges of a daughter card. The pivotal levers are mounted on opposing ends of the top edge of a daughter card, and the fulcrums are mounted on the two opposing frames of the system chassis. This is also an inexpensive solution. However, it is not suitable for daughter cards that are "centrally" located, away from the chassis, or daughter cards that do not span the entire length/width of the chassis.

Additionally, as a result of the increased heat dissipation and electromagnetic interference (EMI) shielding requirements of the newer high speed processors, new approaches have been devised to package, processor cards to provide improved flexibility on the employment of heat sinks, and improved EMI shielding. See for example U.S. patent application Ser. No. 08/739,815, entitled A Processor Card Assembly, filed contemporaneously, and having common assignee interest with the present invention. Thus, a corresponding new approach to retain such processor card assembly that meets the increased rigidity and stability requirement, but without the cost of the card cage approach, nor requiring the processor card assembly to span the entire length/width of the chassis, is need.

SUMMARY OF THE INVENTION

The present invention is an apparatus for retaining a processor card assembly, such that a processor card of the assembly will remain in a connected position. The apparatus includes a first and a second retention arm having a first and a second window disposed at the respective top ends of the retention arms for accepting a first and a second latch of the processor card assembly for latching the processor card assembly to the apparatus. In one embodiment, each retention arm further includes a first and a second slot, also disposed at the top end, for mating with a first protruding lug from a cover, and a second protruding lug from a thermal plate of the processor card assembly.

Additionally, each retention arm further includes a first and a second support and fastening feature disposed at opposite sides of the bottom end of the retention arm. Each support and fastening feature includes at least one capturing arm for capturing in place a threaded bushing for accepting a threaded fastener for fastening the apparatus to the motherboard. In one embodiment, each support and fastening feature includes two capturing arms, and each capturing arm having indentations on the top surface of the capturing arm for mating with complementarily sized fingers of a snap-in retainer for securing the threaded bushing.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details.

Figure 1:
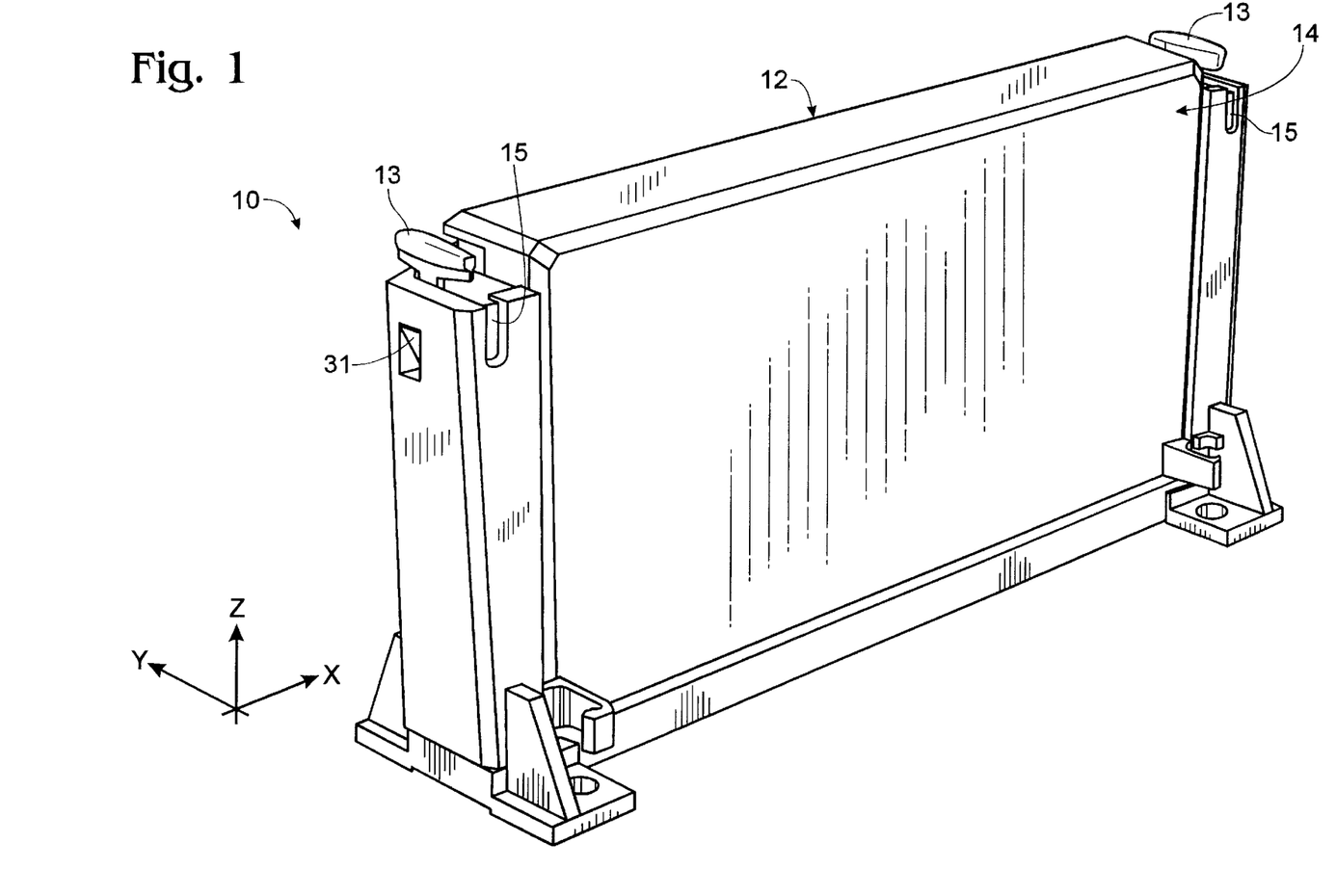
FIG. 1 is a perspective view of one embodiment of the processor card assembly retaining apparatus of the present invention, shown retaining a processor card assembly.
Figure 2:
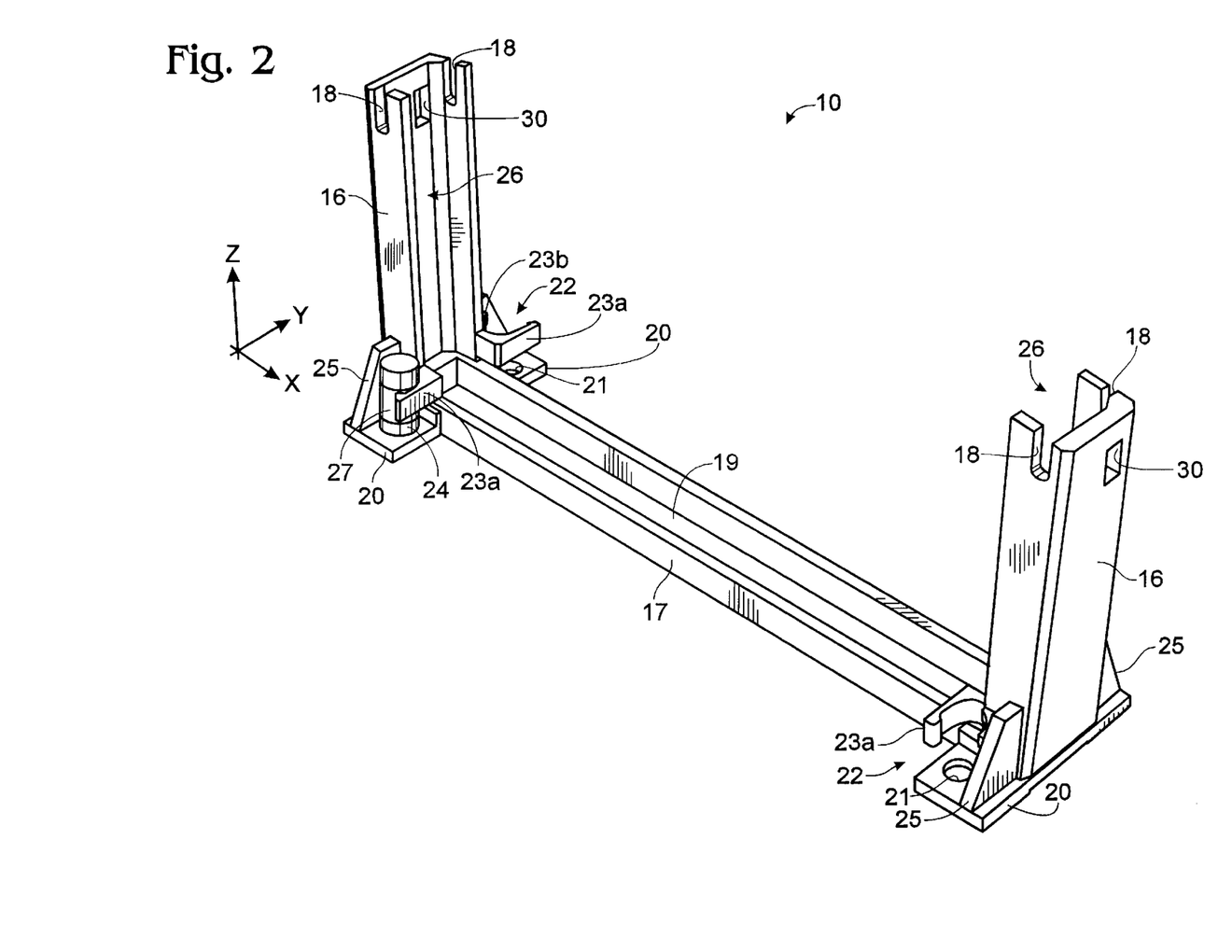
FIG. 2 is a perspective view of the same embodiment of the processor card assembly retaining apparatus of FIG. 1, shown without the processor card assembly.
Figure 3:
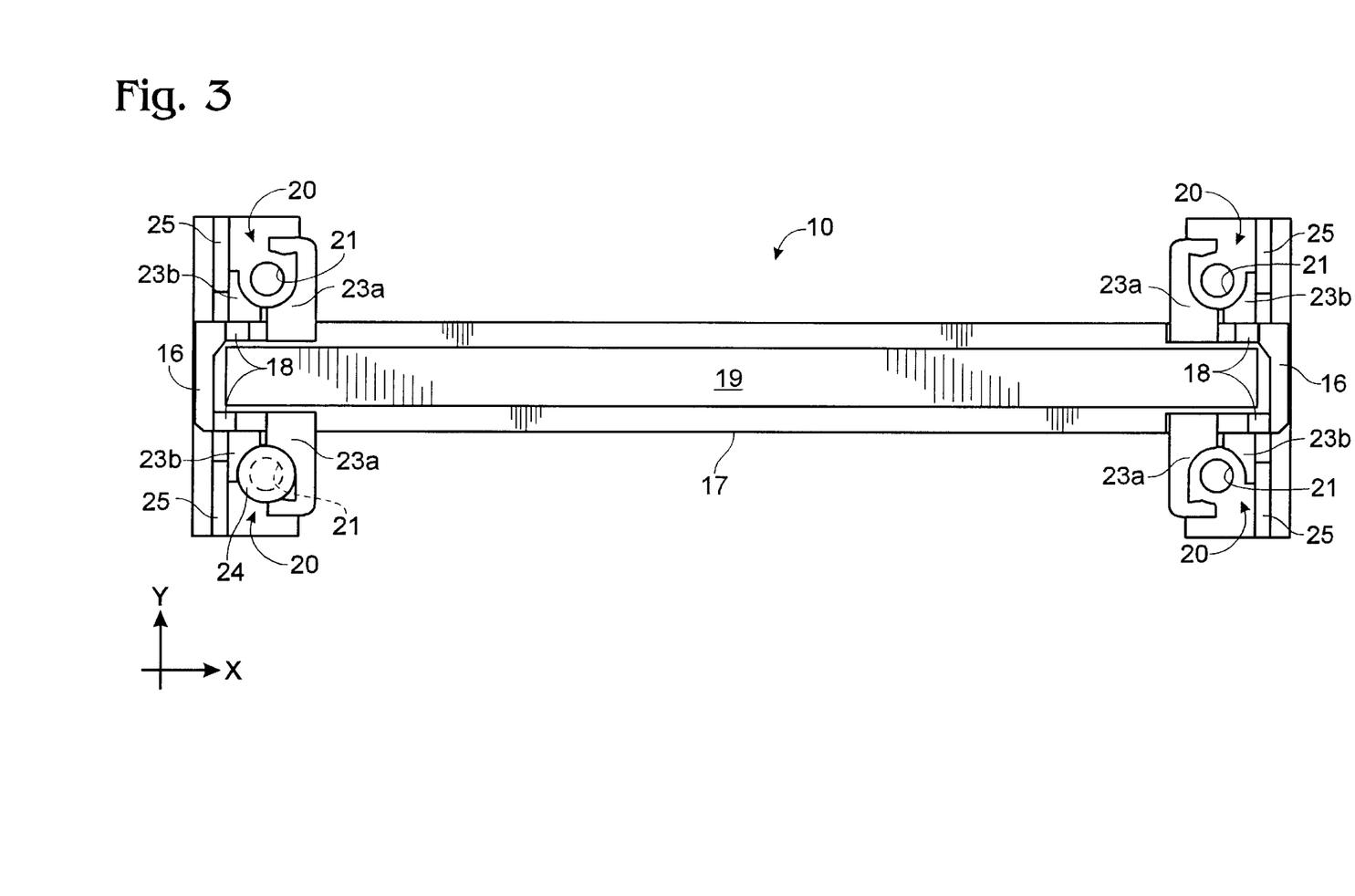
FIGS. 3–5 are top, front, and side views of the processor card assembly retaining apparatus of FIG. 2.
Figure 4:
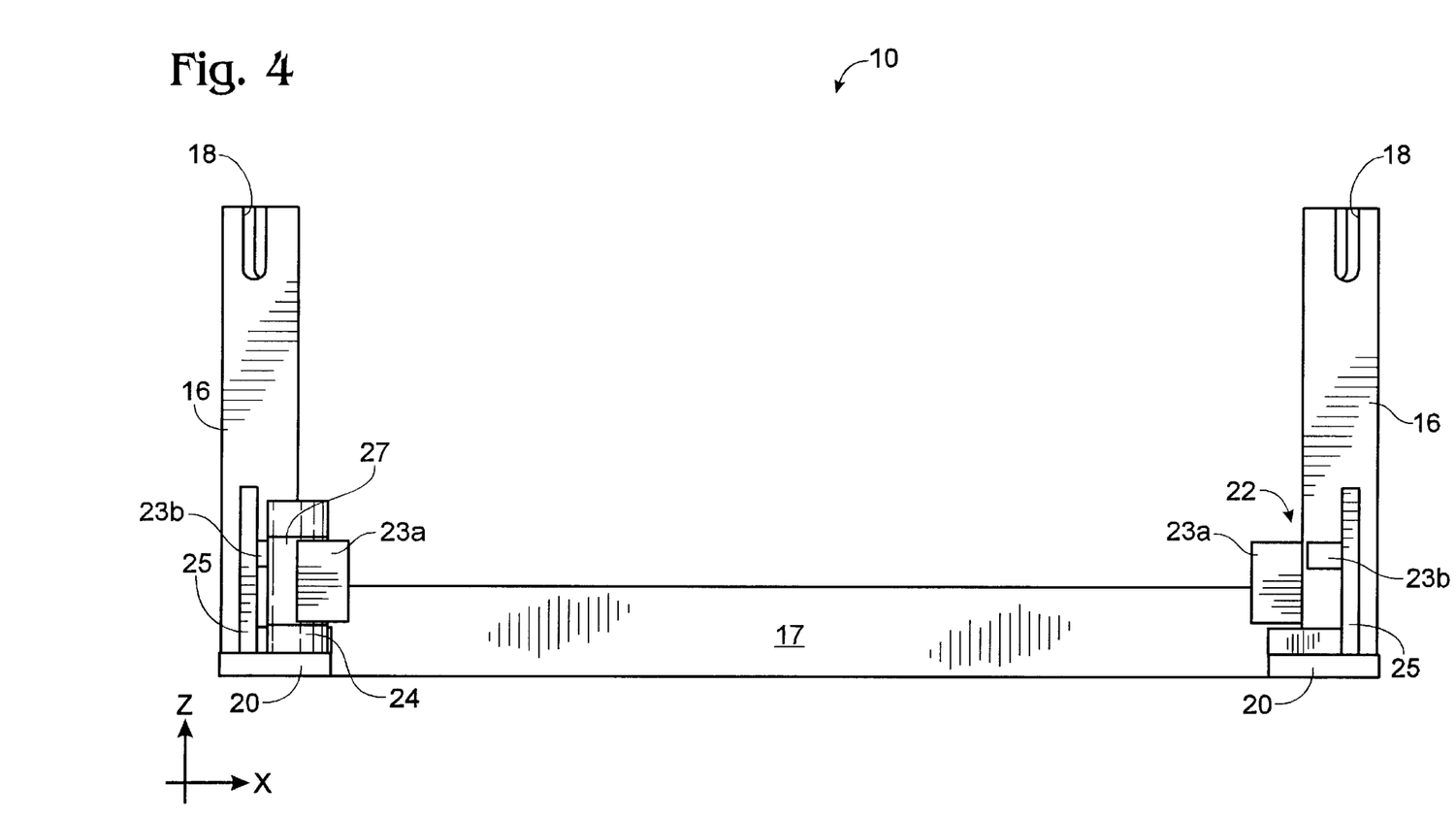
Figure 5:
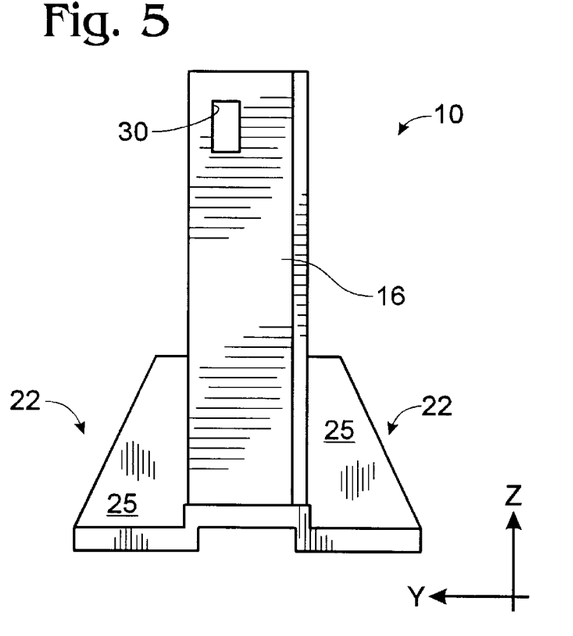
Figure 6:
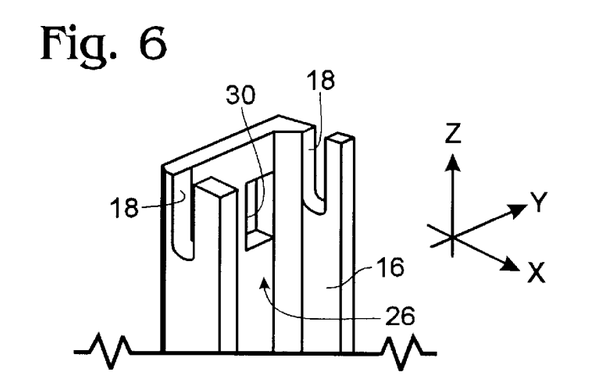
FIGS. 6–7 are zoom-in views of the top end of one of the retention arm.
Figure 7:
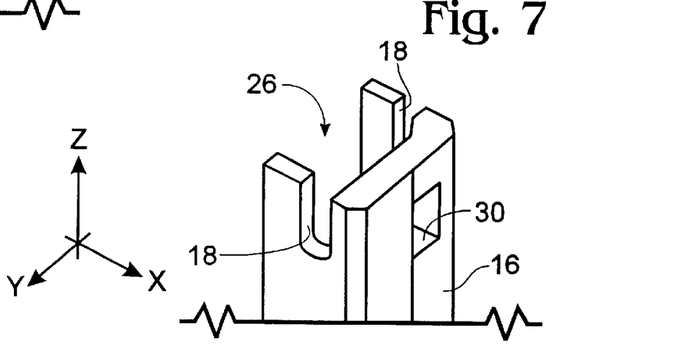
Figure 8:
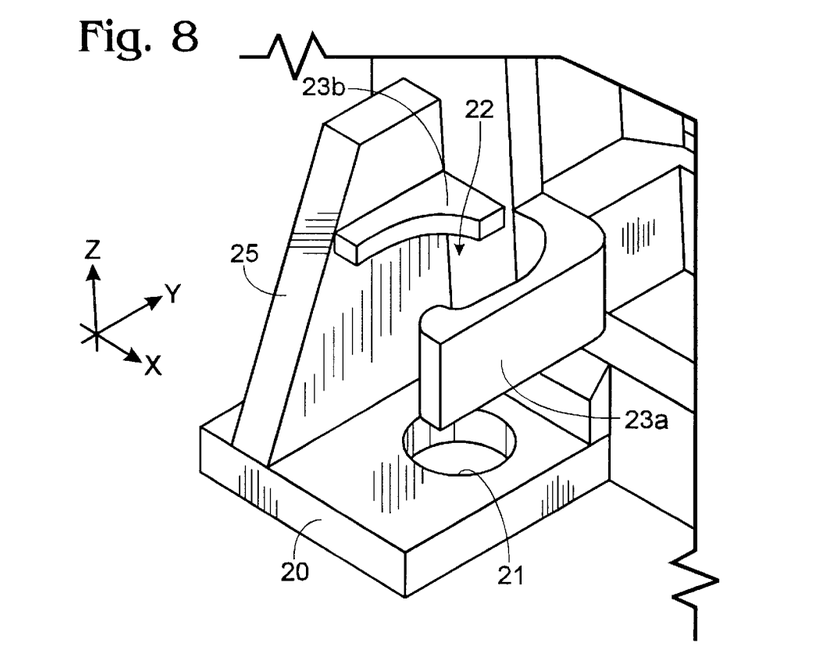
FIGS. 8–9 are zoom-in views of one side of the bottom end of one of the retention arm.
Figure 9:
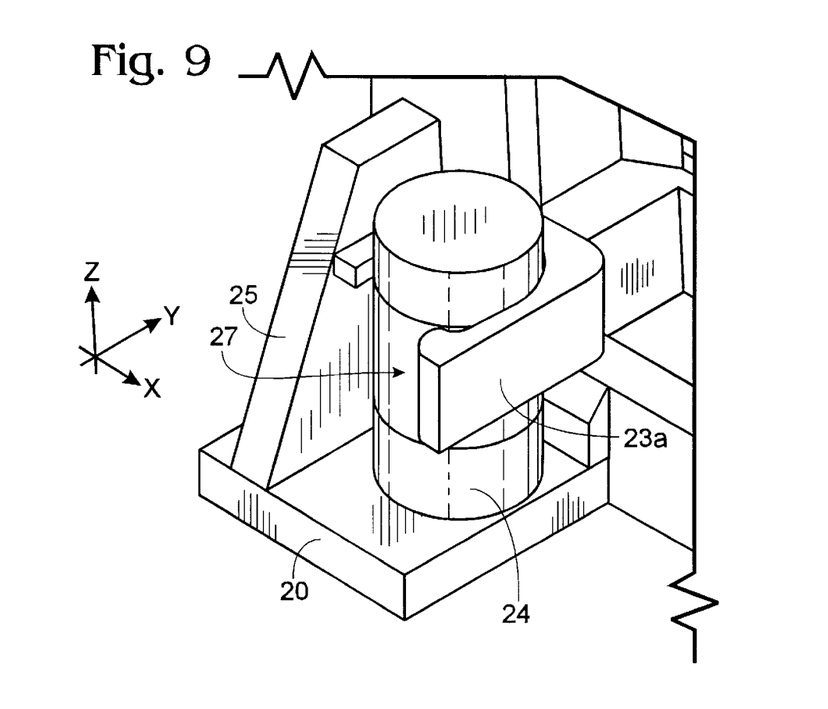
Figure 10:
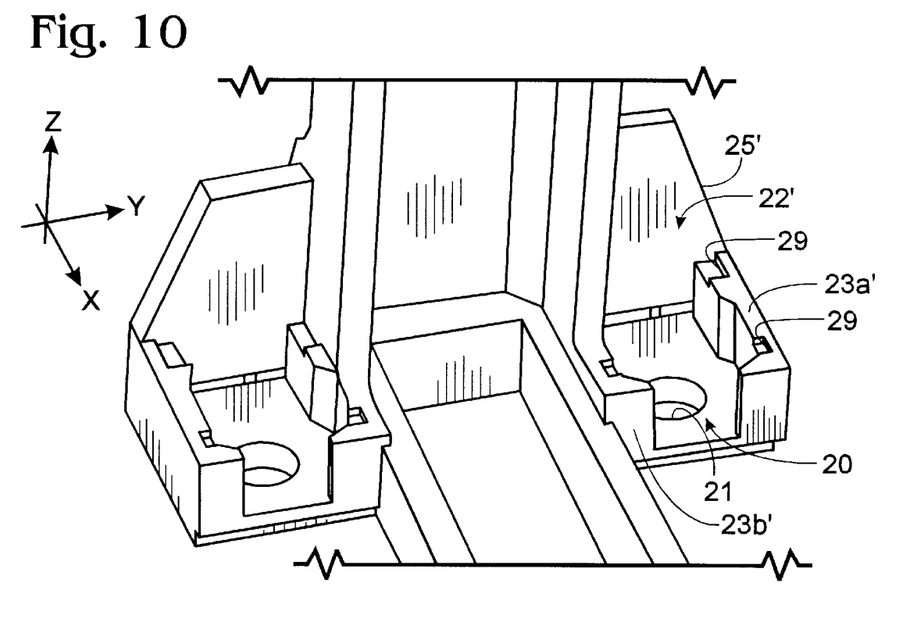
FIGS. 10–11 are zoom-in views of one side of the bottom end of one of the retention arm of an alternate embodiment.
Figure 11:
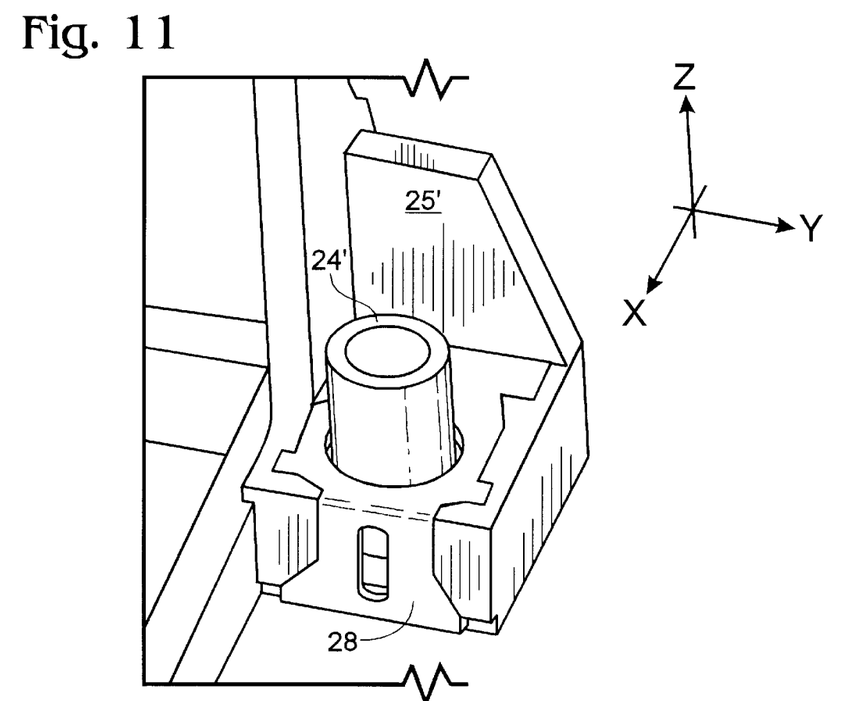
Figure 12:
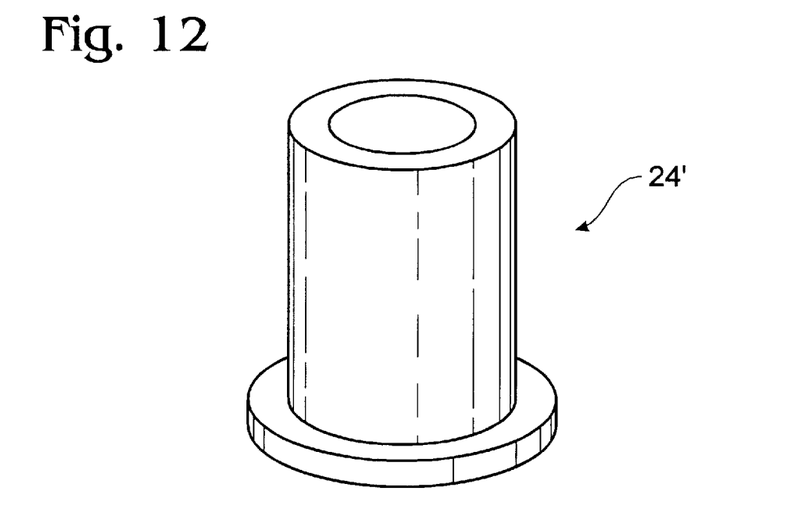
FIGS. 12–13 illustrates are perspective views of the threaded bushing and snap-in retainer of FIGS. 10–11.
Figure 13:
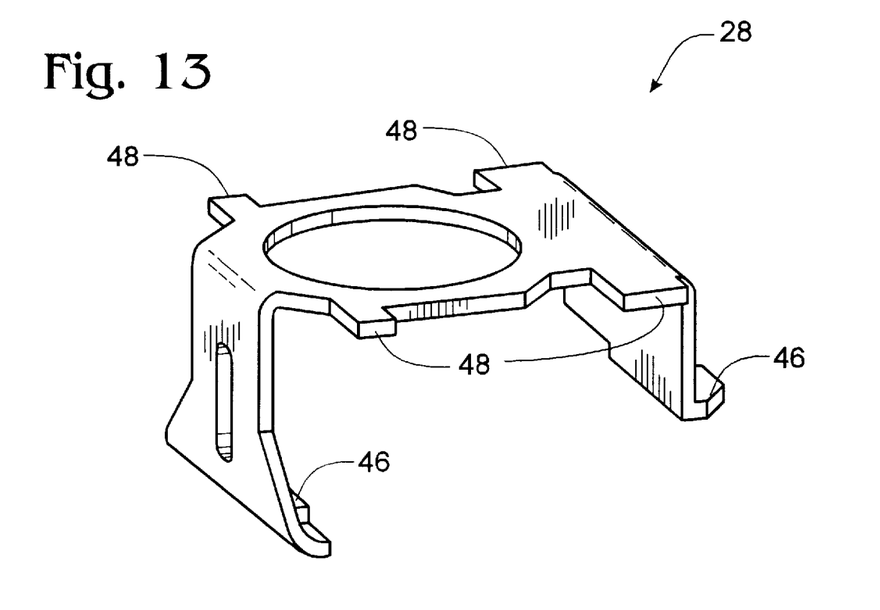

Referring now to FIG. 1, wherein one embodiment of the processor card assembly retention apparatus of the present invention 10 is illustrated in conjunction with the processor card assembly 12 being retained. As shown, processor card assembly 12 includes in particular cover 14 having latches 13 that can flex from an unlocked position to a locked position, and vice versa. Cover 14 also includes protruding lugs 15. Additionally, processor card assembly 12 further includes a thermal plate (not shown) disposed at the other side of cover 14. Together, cover 14 and the thermal plate form a case for housing a processor card (not shown) having a processor (not shown) disposed thereon. For the illustrated embodiment, similar to cover 14, the thermal plate also includes a pair of protruding lugs. The thermal plate also includes features for facilitating mounting of a heat sink against it. For these and other features of processor card assembly 12, refer to the above identified U.S. patent application, which is hereby fully incorporated by reference.

FIGS. 2–9 illustrate this embodiment of processor card assembly retention apparatus 10 from various views in further detail. As shown, retention apparatus 10 includes retention arms 16 and longitudinal base 17 joining each other to form a U-shaped structure. Longitudinal base 17 includes cavity 19 to allow the entire structure to be fitted over a longitudinal connector of a motherboard (not shown), against which the processor card of processor card assembly 12 is to remain connected to. Retention arms 16 include channels 24 to allow processor card assembly 12 to be glided in place, when connecting the processor card to the connector.

Disposed at the top end of each retention arm 16 are window 20 and slots 18. Windows 20 are used to accept latches 15 of processor card assembly 12 for latching processor card assembly 12 to retention apparatus 10. One pair of the slots 18 is used to mate with protruding lugs 15 from cover 14 of processor card assembly 12, while the other pair of slots 18 are used to mate with the protruding lugs from the thermal plate of processor card assembly 12. Together, slots 18 and the protruding lugs facilitate keeping retention arms 16 from flexing outward.

Experience have shown that by having processor card assembly 12 be latched to retention arms 16 allow a simpler design for retention arms 16, as well as improved manufacturability, in terms of engaging processor card assembly 12 and retention apparatus 10, and yet processor card assembly 12 is more snugly engaged to retention arms 16 than other approaches that employ retention features that extend from retention arms 16 to hold processor card assembly 12 in place.

Disposed on opposite sides at the bottom end of each retention arm 16 are support and fastening features 22. Each support and fastening feature 22 includes base foot 20 and gusset 25 for providing support and stability to retention apparatus 10. Each base foot 20 includes a centrally disposed hole 21 for accepting a fastener (not shown) for mounting retention apparatus 10 to the motherboard. For the illustrated embodiment, each support and fastening feature 22 further includes a pair of capture arms 23a and 23b for capturing in place threaded bushing 24. Threaded bushings 24 allow usage of threaded fasteners of a type that can provide adequate downward force on base feet 20 to counteract the upward force that might be exerted on retention arms 16 through window 18 by latches 15 due to shock and vibration. For the illustrated embodiment, each threaded bushing 24 includes groove 27 for facilitating capturing by capturing arms 23a and 23b. Each threaded bushing 24, including groove 27, is complementarily sized to allow vertical movement by the threaded bushing. In particular, each threaded bushing 24 has a vertical dimension of sufficient height to facilitate the application of fastening tools against the threaded bushing 24.

FIGS. 10–13 illustrate an alternate design for support and fastening feature 22'. As shown, each support and fastening feature 22' also includes base 20 with a centrally disposed hole 21, and a slightly different shape gusset 25' for providing support and stability to retention apparatus 10. Each support and fastening feature 22' also includes a pair of capturing arms 23a' and 23b' that are disposed in a different orientation. Additionally, each capturing arm 23a' or 23b' includes a number of indentations 29 disposed on the top surface of the capturing arm 23a' or 23b' for accepting complementarily sized protruding fingers 48 of snap-in retainer 28 for aiding in the capturing and retention of threaded bushing 24'.

As will be appreciated by those skill in the art, the materials used, and the precise dimensions of the various aspects of retention body 12, such as the length of arms 16, the length of base 17, the thickness of gusset 25 etc. are functionally dependent on the size of processor card assembly 12, and the amount of shock and vibration retention apparatus 10 needs to overcome. In one application for a processor card assembly enclosing a processor card having dimensions of 2.25 in×5 in×0.062 in, the amount of shocks and vibrations apparatus 10 is required to overcome are 100 G for 6 ms duration in sawtooth waveform for shock, and 50–2000 HZ, 9 grms, and 15 min/axis for vibration, the materials used are glass filled polycarbonate.

As will be appreciated by those skilled in the art, in addition to the various advantages enumerated in the above description, the retention apparatus of the present invention is suitable for use in virtually all the popular form factors of today's desktop personal computers.

While the method and apparatus of the present invention has been described in terms of the above illustrated embodiments, those skilled in the art will recognize that the invention is not limited to the embodiments described. The present invention can be practiced with modification and alteration within the spirit and scope of the appended claims. The description is thus to be regarded as illustrative instead of restrictive on the present invention.

Thus, a retention apparatus for cost effectively retaining a processor card assembly, such that a processor card of the assembly will remain in a connected position has been described.

What is claimed is:

1. An apparatus for securely retaining a processor card of a processor card assembly in a connected position, comprising a first and a second retention arm, the first retention arm having a first window for accepting a first latch of the processor card assembly to latch the processor card assembly to the apparatus, and a first and second support and fastening feature disposed at opposite sides of a bottom end of the first retention arm for supporting and fastening the apparatus and the latched processor card assembly to a motherboard, each of the support and fastening features having at least one capturing arm for capturing in place a threaded bushing for accepting a threaded fastener for fastening the apparatus to the motherboard.

2. The apparatus as set forth in claim 1, wherein said first arm further comprises a first slot for mating with a first protruding lug from a cover of the processor card assembly.

3. The apparatus as set forth in claim 2, wherein said second arm further comprises a second slot for mating with a second protruding lug from the cover of the processor card assembly.

4. The apparatus as set forth in claim 1, wherein said first arm further comprises a first slot for mating with a first protruding lug from a thermal plate of the processor card assembly.

5. The apparatus as set forth in claim 4, wherein said second arm further comprises a second slot for mating with a second protruding lug from the thermal plate of the processor card assembly.

6. The apparatus as set forth in claim 1, wherein each of the support and fastening features includes a plurality of capturing arms for capturing in place the threaded bushing, and each of the capturing arms having a plurality of indentations disposed on a top surface of the capturing arm for accepting complementarily sized fingers of a snap-in retainer for securing the threaded bushing.

7. The apparatus as set forth in claim 1, wherein the apparatus further comprises a third and a fourth support and fastening feature disposed at opposite sides of a bottom end of the second arm for securing the apparatus and the latched processor card assembly to the motherboard, each of the third and fourth support and fastening features also having at least one capturing arm for capturing in place a threaded bushing for accepting a threaded fastener for fastening the apparatus to the motherboard.

8. An apparatus for securing a processor card of a processor card assembly in a connected position, comprising a first and a second arm for engaging with the processor card assembly, the first and second arms including a first and a second support and fastening feature, as well as a third and a fourth support and fastening feature disposed at opposite sides of respective bottom ends the first and second arms for supporting and fastening the apparatus and the engaged processor card assembly to a motherboard, each of the support and fastening features having at least one capturing arm for capturing a threaded bushing for accepting a threaded fastener for fastening the apparatus to the motherboard.

9. The apparatus as set forth in claim 8, wherein each of the support and fastening features includes a plurality of capturing arms for capturing in place the threaded bushing, and each of the capturing arms having a plurality of indentations disposed on a top surface of the capturing arm for accepting complementarily sized fingers of a snap-in retainer for securing the threaded bushing.

10. An apparatus for securing a processor card of a processor card assembly in a connected position, comprising a first and a second arm having a first and a second window disposed at respective top ends of the first and second arm for accepting a first and a second latch of the processor card assembly for latching the processor card assembly to the apparatus, the first and second arms further including a first and a second support and fastening feature as well as a third and a fourth support and fastening feature disposed at opposite sides of respective bottom ends of the first and second arms for supporting and fastening the apparatus and the engaged processor card assembly to a motherboard, each of the support and fastening features having at least one capturing arm for capturing in place a threaded bushing for accepting a threaded fastener for fastening the apparatus to the motherboard.

11. The apparatus as set forth in claim 10, wherein said first and second arms further comprise a first and a second slot respectively for mating with a first and a second protruding lug respectively from a cover of the processor card assembly.

12. The apparatus as set forth in claim 10, wherein said first and second arms further comprise a first and a second slot respectively for mating with a first and a second protruding lug respectively from a thermal plate of the processor card assembly.

13. The apparatus as set forth in claim 10, wherein said first arm further comprises a first and a second slot for mating with a first protruding lug from a cover and a second protruding lug from a thermal plate of the processor card assembly.

14. The apparatus as set forth in claim 10, wherein each of the fastening features includes a plurality of capturing arms for capturing in place the threaded bushing, and each of the capturing arms having a plurality of indentations disposed on a top surface of the capturing arm for accepting complementarily sized fingers of a snap-in retainer for securing the threaded bushing.

15. The apparatus of claim 1 wherein the second retention arm further comprises a second window for accepting a second latch of the processor card assembly, and a third and fourth support and fastening feature disposed at opposite sides of a bottom end of the second retention arm for supporting and fastening the apparatus and the latched processor card assembly to the motherboard.

* * * * *